(12) United States Patent
Okawa

(10) Patent No.: US 9,461,152 B2
(45) Date of Patent: Oct. 4, 2016

(54) SEMICONDUCTOR DEVICE

(71) Applicant: Toyota Jidosha Kabushiki Kaisha, Toyota-shi Aichi-ken (JP)

(72) Inventor: Takashi Okawa, Nisshin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/044,167

(22) Filed: Feb. 16, 2016

(65) Prior Publication Data
US 2016/0240635 A1 Aug. 18, 2016

(30) Foreign Application Priority Data

Feb. 16, 2015 (JP) .................................. 2015-027648

(51) Int. Cl.
| H01L 27/082 | (2006.01) |
| H01L 27/102 | (2006.01) |
| H01L 29/735 | (2006.01) |
| H01L 29/08 | (2006.01) |
| H01L 29/10 | (2006.01) |

(52) U.S. Cl.
CPC ......... *H01L 29/735* (2013.01); *H01L 29/0808* (2013.01); *H01L 29/0821* (2013.01); *H01L 29/1008* (2013.01)

(58) Field of Classification Search
CPC ............. H01L 29/0821; H01L 29/735; H01L 29/0808; H01L 29/1008
USPC ....................................................... 257/587
See application file for complete search history.

(56) References Cited

U.S. PATENT DOCUMENTS

| 5,329,142 A * | 7/1994 | Kitagawa ............ H01L 29/7455 257/137 |
| 9,231,090 B2 * | 1/2016 | Higuchi .............. H01L 29/4236 |

FOREIGN PATENT DOCUMENTS

JP    S6464257 A    3/1989

* cited by examiner

*Primary Examiner* — Theresa T Doan
(74) *Attorney, Agent, or Firm* — Dinsmore & Shohl LLP

(57) ABSTRACT

A semiconductor device includes a first main electrode; a second main electrode; a first semiconductor region of a first conductivity type; a second semiconductor region of the first conductivity type; a third semiconductor region of a second conductivity type arranged between the first semiconductor region and the second semiconductor region; and a depletion layer suppression region arranged inside of the third semiconductor region and being configured to suppress a spread of a depletion layer extending in the third semiconductor region when a reverse bias voltage is applied between the second semiconductor region and the third semiconductor region. The third semiconductor region includes a shortest region where a distance between a first boundary surface and a second boundary surface is shortest, and the shortest region includes a region where the depletion layer suppression region does not exist between the first boundary surface and the second boundary surface.

7 Claims, 4 Drawing Sheets

SEMICONDUCTOR DEVICE

CROSS-REFERENCE TO RELATED APPLICATION

This application claims priority to Japanese Patent Application No. 2015-027648 filed on Feb. 16, 2015, the entire contents of which are hereby incorporated by reference into the present application.

TECHNICAL FIELD

A technology disclosed herein relates to a semiconductor device.

DESCRIPTION OF RELATED ART

There is a known semiconductor device which is provided with a first main electrode and a second main electrode with a semiconductor region interposed therebetween and which can switch between a state in which a current flows between the first main electrode and the second main electrode and a state in which no current flows between the first main electrode and the second main electrode. For example, Patent Literature 1 (Japanese Patent Application Publication No. S64-64257) discloses a bipolar transistor including a collector region, a base region provided on the collector region, and an emitter region provided on the base region. The emitter region is separated from the collector region by the base region. By controlling a base current that is supplied to the base region, this semiconductor device switches between a state in which a current flows between the emitter region and the collector region and a state in which no current flows between the emitter region and the collector region.

The base region of this bipolar transistor includes a first portion that is large in size along a depth direction and a second portion that is small in size along the depth direction. In the first portion, a distance between the emitter region and the collector region is long. In the second portion, a distance between the emitter region and the collector region is short. This bipolar transistor uses the second portion of the base region to ensure a high current amplification factor and uses the first portion of the base region to ensure a high collector withstand voltage.

The technology of Patent Literature 1 provides the base region with the first portion, which is large in size along the depth direction, in order to raise the withstand voltage of the semiconductor device. However, the provision of the first portion, which is large in size along the depth direction, causes an increase in saturation voltage between the base region and the emitter region.

The present disclosure discloses a semiconductor device whose withstand voltage can be improved without the increase in saturation voltage.

SUMMARY

A semiconductor device disclosed in the present disclosure comprises: a first main electrode; a second main electrode; a first semiconductor region of a first conductivity type being in electrically contact with the first main electrode; a second semiconductor region of the first conductivity type being in electrically contact with the second main electrode; a third semiconductor region of a second conductivity type arranged between the first semiconductor region and the second semiconductor region, and separating the first semiconductor region and the second semiconductor region; and a depletion layer suppression region arranged inside of the third semiconductor region, and being configured to suppress a spread of a depletion layer extending in the third semiconductor region when a reverse bias voltage is applied between the second semiconductor region and the third semiconductor region. The third semiconductor region comprises a shortest region where a distance between a first boundary surface and a second boundary surface is shortest, the first boundary surface being a boundary surface between the third semiconductor region and the first semiconductor region, and the second boundary surface being a boundary surface between the third semiconductor region and the second semiconductor region. The shortest region includes a region where the depletion layer suppression region does not exist between the first boundary surface and the second boundary surface when the first boundary surface and the second boundary surface are viewed along a direction which connects the first boundary surface and the second boundary surface at a shortest distance from each other.

In the semiconductor device described above, the depletion layer suppression region is arranged inside of the third semiconductor region. When the semiconductor device is turned off and a reverse bias voltage is applied between the second semiconductor region and the third semiconductor region, a depletion layer extends toward the third semiconductor region. A withstand voltage of the semiconductor device is defined by a distance between the depletion layer extending in the third semiconductor region and the first boundary surface. That is, the region where the distance between the first boundary surface and the second boundary surface is shortest is a region where the withstand voltage is lowest. The depletion layer suppression region arranged inside of the third semiconductor region can suppress an extension of a depletion layer toward the third semiconductor region inside of the third semiconductor region. This makes it possible to suppress the extension of the depletion layer in the region where the distance between the first boundary surface and the second boundary surface is shortest. This as a result makes it possible to improve the withstand voltage of the semiconductor device. Further, the first boundary surface and the second boundary surface include a region where the depletion layer suppression region does not exist between the first boundary surface and the second boundary surface when the first boundary surface and the second boundary surface are viewed along the direction which connects the first boundary surface and the second boundary surface at the shortest distance from each other. That is, at least a part of the region where the distance between the first boundary surface and the second boundary surface is shortest is not blocked by the depletion layer suppression region. For this reason, the shortest distance between the first boundary surface and the second boundary surface through which carriers can pass remains unchanged. This suppresses a change in saturation voltage depending on the presence or absence of the depletion layer suppression region.

The present disclosure discloses a semiconductor device whose withstand voltage can be improved without an increase in saturation voltage.

DETAILED DESCRIPTION OF THE EMBODIMENTS

First Embodiment

Figure 1:
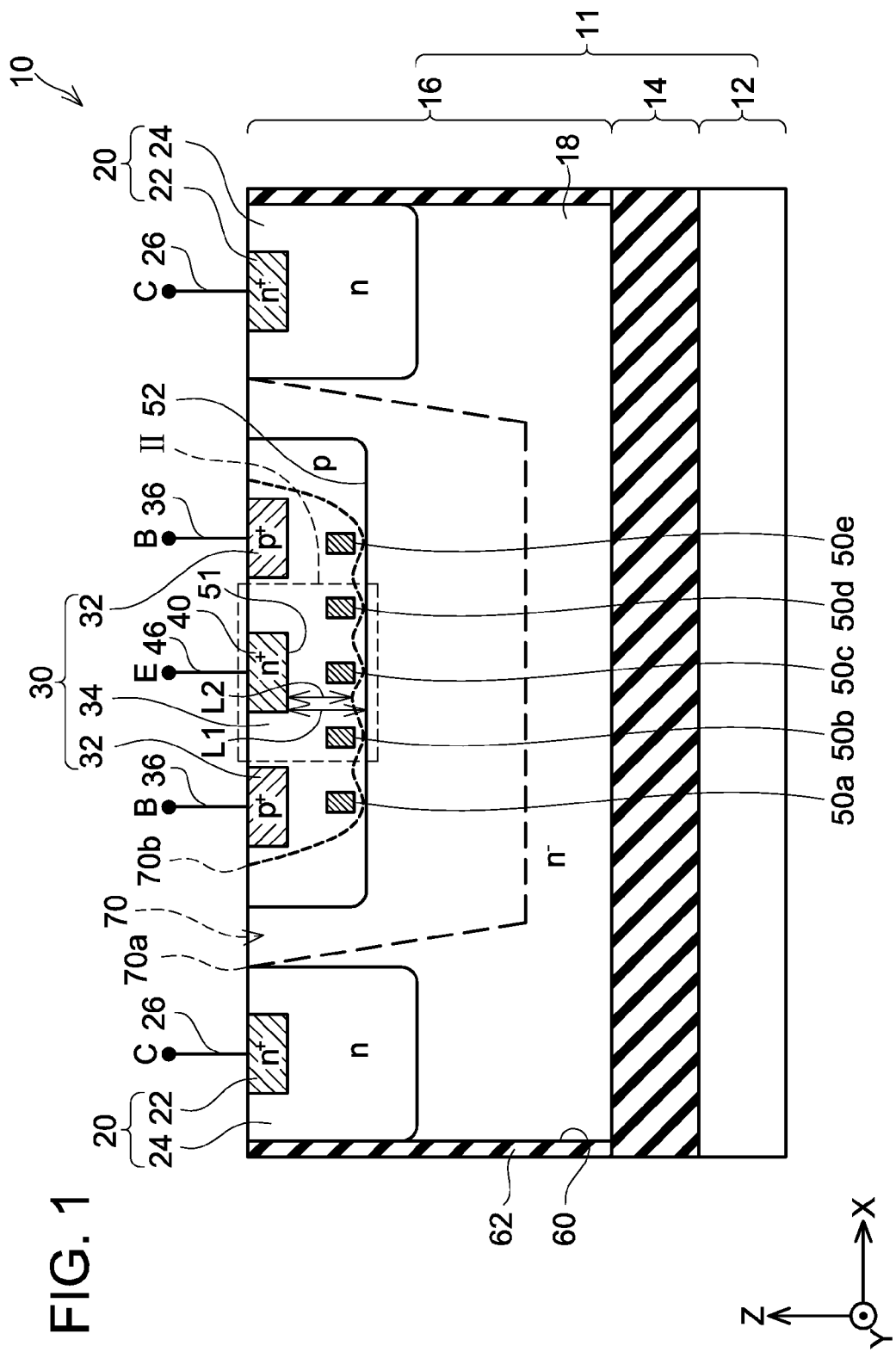
FIG. 1 is a cross-sectional view of a semiconductor device according to a first embodiment.
Figure 2:
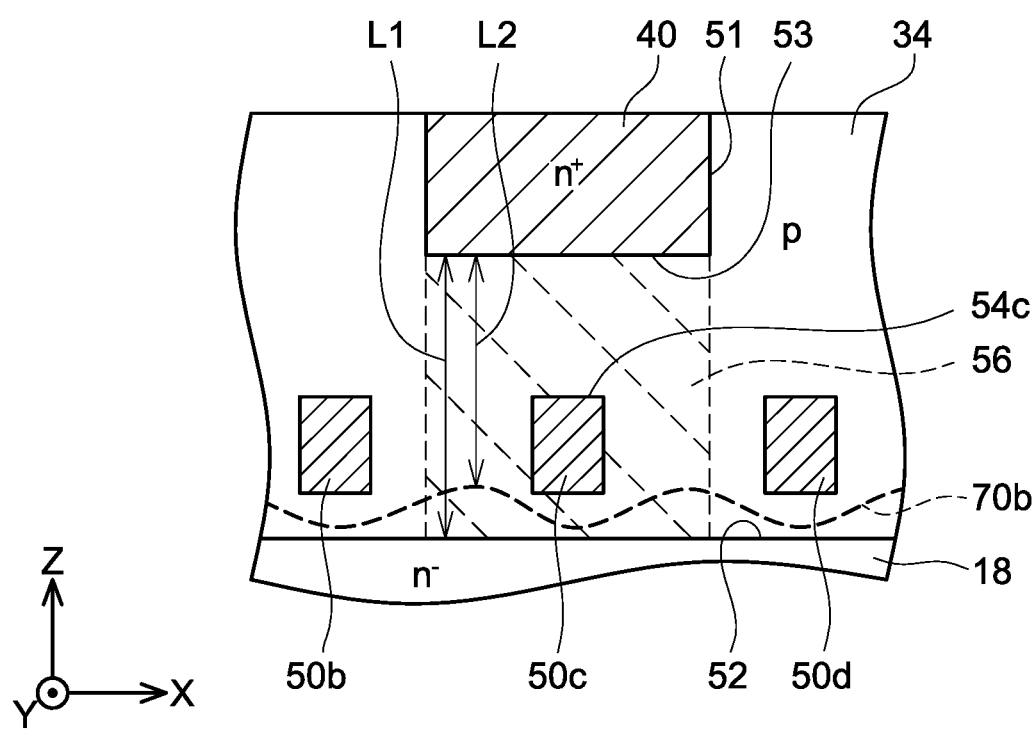
FIG. 2 is an enlarged view of a portion indicated by dashed lines in FIG. 1.

A semiconductor device according to a first embodiment will be described with reference to FIGS. 1 and 2. As shown in FIG. 1, a semiconductor device 10 according to the present embodiment includes a semiconductor substrate 11 composed mainly of Si. The semiconductor substrate 11 includes a back surface layer 12, an embedded insulating film 14 provided on a front surface side of the back surface layer 12, and a semiconductor layer 16 provided on a front surface side of the embedded insulating film 14. Further provided on a front surface of the semiconductor layer 16 are electrodes 26, 36, and 46, metal wires (not illustrated), and the like. The semiconductor device 10 according to the present embodiment is a lateral npn transistor.

An n-type emitter region 40, an n-type collector region 20, a p-type base region 30, a plurality of p-type depletion layer suppression regions 50a to 50e, and an n-type region 18 are provided in the semiconductor layer 16. The emitter region 40, the collector region 20, the base region 30, and the n-type region 18 are each exposed on a part of the front surface of the semiconductor layer 16. The base region 30 is arranged between the collector region 20 and the emitter region 40. In other words, the emitter region 40 is separated from the collector region 20 by the base region 30. The plurality of depletion layer suppression regions 50a to 50e is located inside of the base region 30 and arranged below the emitter region 40. It should be noted that the plurality of depletion layer suppression regions 50a to 50e has the same structure. In the following, the plurality of depletion layer suppression regions 50a to 50e is sometimes referred to as "depletion layer suppression regions 50" in case the regions 50a to 50e may be indiscriminately expressed.

A concentration of n-type impurities of the n-type region 18 is lower than a concentration of n-type impurities of a low-concentration region 24 of the collector region 20. The term "concentration of impurities" here means an average concentration of impurities in that region. The same applies to the term "concentration of impurities" appearing hereinafter in the present disclosure. The n-type region 18 is in contact with the embedded insulating film 14, the collector region 20, the base region 30, and a device-isolation trench 60. The n-type region 18 separates the collector region 20 and the base region 30 from each other.

The device-isolation trench 60, which is provided in the semiconductor layer 16, serves to separate the semiconductor device 10 from another region (not illustrated). The device-isolation trench 60 extends downward from the front surface of the semiconductor layer 16 to a front surface of the embedded insulating film 14. The device-isolation trench 60 is provided with an isolating insulating layer 62 covering an inner wall of the device-isolation trench 60.

A concentration of n-type impurities of the emitter region 40 is higher than a concentration of n-type impurities of the n-type region 18. The emitter region 40 is in the shape of island formed in a range exposed on the front surface of the semiconductor layer 16. The emitter region 40 has its side and rear surfaces in contact with the base region 30. The emitter region 40 has its front surface connected to an emitter electrode 46.

The collector region 20 includes a high-concentration region 22 having a high concentration of n-type impurities and the low-concentration region 24 having a lower concentration of n-type impurities than the high-concentration region 22. The collector region 20 is in the shape of islands formed in a range exposed on the front surface of the semiconductor layer 16. The collector region 20 is spaced from the emitter region 40. In the present embodiment, a long distance is ensured between the collector region 20 and the emitter region 40, as the base region 30 and the n-type region 18 are arranged between the collector region 20 and the emitter region 40. The collector region 20 has its front surface connected to a collector electrode 26.

The base region 30 includes a high-concentration region 32 having a high concentration of p-type impurities and a low-concentration region 34 having a lower concentration of p-type impurities than the high-concentration region 32. The high-concentration region 32 has its side and rear surfaces in contact with the low-concentration region 34. The base region 30 is in the shape of islands formed in a range exposed on the front surface of the semiconductor layer 16. The base region 30 separates the emitter region 40 and the n-type region 18 from each other. The base region 30 also separates the emitter region 40 and the collector region 20 from each other. The base region 30 has its front surface connected to a base electrode 36. The base region 30 has its rear surface substantially parallel to the front surface of the semiconductor layer 16.

Each of the depletion layer suppression regions 50 is configured of a p-type semiconductor region. A concentration of p-type impurities of each of the depletion layer suppression regions 50 is higher than a concentration of p-type impurities of the low-concentration region 34. It should be noted that each of the depletion layer suppression regions 50 may be configured of an insulating region. The depletion layer suppression regions 50 are located inside of the base region 30 and arranged below the emitter region 40. The depletion layer suppression regions 50 are arranged at regular intervals substantially parallel to the front surface of the semiconductor layer 16. The depletion layer suppression regions 50 are arranged inside of the base region 30 and in a vicinity of a boundary surface 52, which is a boundary surface between the base region 30 and the n-type region 18. As shown in FIG. 2, the depletion layer suppression region 50c is arranged inside of a region 56 where a distance between a boundary surface 51 and the boundary surface 52 is shortest, the boundary surface 51 being a boundary surface between the base region 30 and the emitter region 40, and the boundary surface 52 being a boundary surface between the base region 30 and the n-type region 18. An area of a surface 54c of the depletion layer suppression region 50c that faces the emitter region 40 is smaller than an area of a surface 53 of the emitter region 40 that faces the depletion layer suppression region 50c. The "area" here refers to a multiplication product of a width along an X direction and a width along Y direction.

Next, operation of the semiconductor device 10 according to the present embodiment will be described. The semiconductor device 10 is turned on by applying, between the emitter electrode 46 and the collector electrode 26, a voltage that makes the collector electrode 26 positive (i.e., a forward voltage to the semiconductor device 10) and applying a predetermined on voltage that makes the base electrode 36 positive with respect to the emitter electrode 46. This causes electrons to flow from the emitter region 40 toward the collector region 20 through the base region 30 and the n-type region 18. This causes a current to flow from the collector electrode 26 to the emitter electrode 46.

While the semiconductor device 10 is ON, electrons are likely to pass through the region 56 where the boundary surface 51 and the boundary surface 52 are placed at a shortest distance L1 from each other. The depletion layer suppression region 50c arranged in the region 56 where the boundary surface 51 and the boundary surface 52 are placed at the shortest distance L1 from each other has the surface 54c which faces the emitter region 40 and whose area is smaller than the area of the surface 53 of the emitter region 40 that faces the depletion layer suppression region 50c. For this reason, the region 56 where the boundary surface 51 and the boundary surface 52 are placed at the shortest distance L1 from each other includes a part which is not blocked by the depletion layer suppression region 50c. This causes electrons to pass through the same shortest distance inside of the base region 30 as a distance in a case where electrons pass in the absence of the depletion layer suppression region 50c. This as a result suppresses a change in saturation voltage depending on the presence or absence of the depletion layer suppression region 50c.

While the semiconductor device 10 is ON, setting the voltage applied to the base electrode 36 to zero with respect to the emitter electrode 46 causes the semiconductor device 10 to be turned off. In this case, the collector region 20 and the base region 30 are brought into a reverse bias state. At this occasion, a depletion layer 70 is formed between the collector region 20 and the base region 30. The depletion layer 70 has one end 70a located closer to the n-type region 18 than the boundary surface 52 between the base region 30 and the n-type region 18. The other end 70b of the depletion layer 70 is located closer to the base region 30 than the boundary surface 52 between the base region 30 and the n-type region 18. In the present embodiment, the depletion layer suppression regions 50 are arranged inside of the base region 30 to be in the vicinity of the boundary surface 52. The concentration of p-type impurities of each of the depletion layer suppression regions 50 is higher than the concentration of p-type impurities of the low-concentration region 34. This makes it possible to suppress the spread of the end 70b toward the emitter region 40 around a region where the depletion layer suppression regions 50 are arranged, as compared with a case where no depletion layer suppression regions 50 are arranged. The semiconductor device 10 improves in withstand voltage with increasing distance between the end 70b and the emitter region 40. The depletion layer suppression region 50c is arranged in the region where the boundary surface 51 and the boundary surface 52 are placed at the shortest distance L1 from each other. That is, the region where the depletion layer suppression region 50c is arranged is a region where the end 70b and the emitter region 40 are placed at a shortest distance L2 from each other in a case where the depletion layer suppression region 50c is not arranged. Since the depletion layer suppression regions 50 suppress the spread of the end 70b toward the emitter region 40, the shortest distance L2 between the end 70b and the emitter region 40 can be increased. This makes it possible to improve the withstand voltage of the semiconductor device 10.

As is evident from these descriptions, the semiconductor device 10 according to the present embodiment includes the depletion layer suppression region 50c arranged in the region 56 inside of the base region 30 where the boundary surface 51 and the boundary surface 52 are placed at the shortest distance L1 from each other. This makes it possible to improve the withstand voltage of the semiconductor device 10 while suppressing an increase in saturation voltage of the semiconductor device 10.

Second Embodiment

Figure 3:
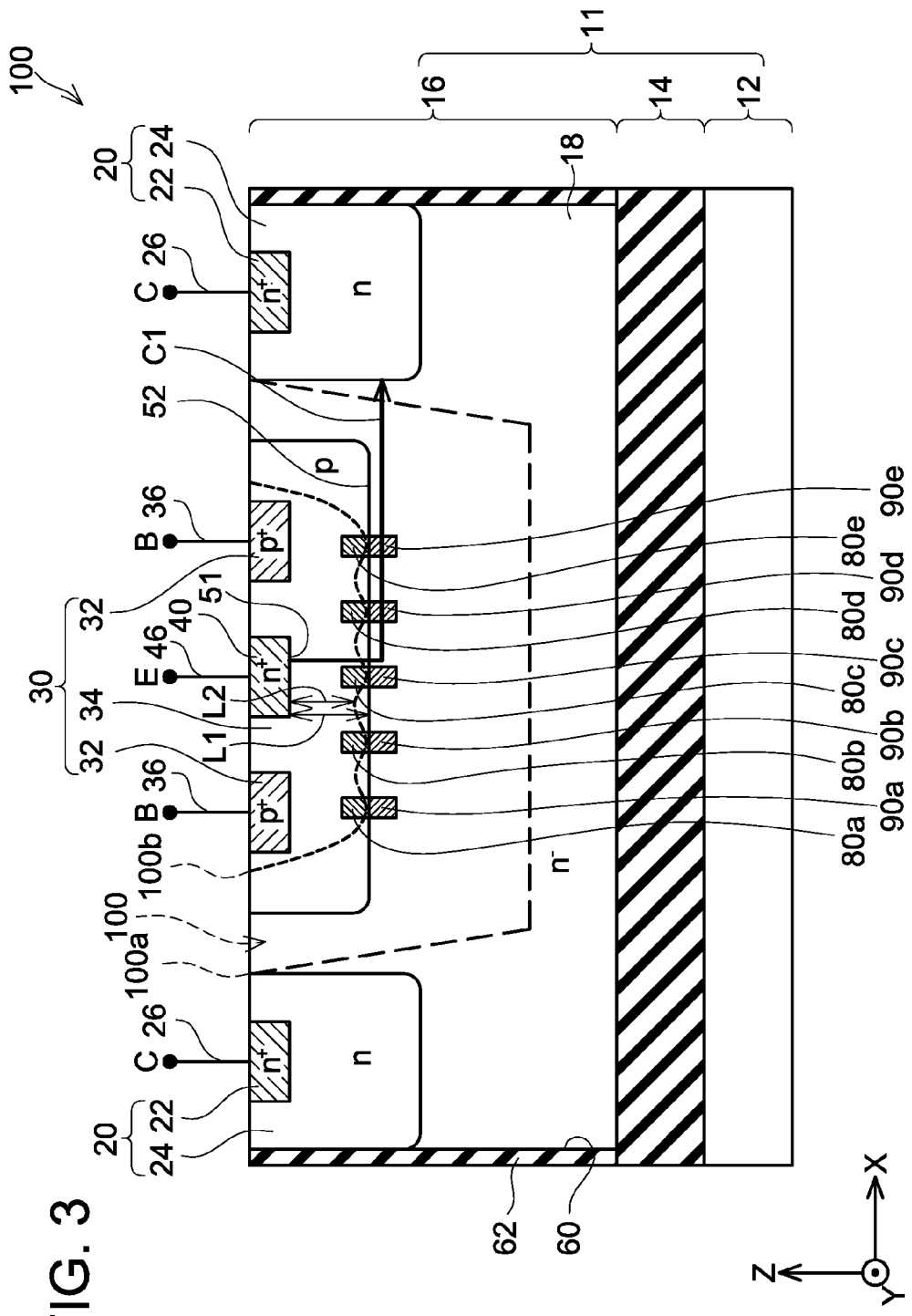
FIG. 3 is a cross-sectional view of a semiconductor device according to a second embodiment.

A second embodiment will be described with reference to FIG. 3. It should be noted that components identical to those of the first embodiment are given the same reference numerals, and as such, will not be described below. In the second embodiment, the semiconductor device 10 includes a plurality of depletion layer suppression regions 80a to 80e and a plurality of n-type semiconductor regions 90a to 90e. It should be noted that the plurality of depletion layer suppression regions 80a to 80e has the same structure. It should also be noted that the plurality of n-type semiconductor regions 90a to 90e has the same structure. In the following, the plurality of depletion layer suppression regions 80a to 80e are sometimes referred to as "depletion layer suppression regions 80" in case the regions 80a to 80e may be indiscriminately expressed, and the plurality of n-type semiconductor regions 90a to 90e are sometimes referred to as "n-type semiconductor regions 90" in case the regions 90a to 90e may be indiscriminately expressed.

Each of the n-type semiconductor regions 90 is configured of an n-type semiconductor region. A concentration of n-type impurities of each of the n-type semiconductor regions 90 is higher than a concentration of n-type impurities of the n-type region 18. The n-type semiconductor regions 90 are located inside of the n-type region 18, and are in contact with the boundary surface 52. Further, the depletion layer suppression regions 80 are located inside of the base region 30, and are in contact with the boundary surface 52. Each of the n-type semiconductor regions 90 is arranged to face a corresponding one of the depletion layer suppression regions 80. An area of a surface of each of the n-type semiconductor regions 90 that faces a corresponding one of the depletion layer suppression regions 80 is equal to an area of a surface of the corresponding depletion layer suppression region 80 that faces that n-type semiconductor region 90. The "area" here refers to a multiplication product of a width along an X direction and a width along Y direction. It should be noted that, alternatively, the area of the surface of each of the n-type semiconductor regions 90 that faces the corresponding one of the depletion layer suppression regions 80 may be smaller than the area of the surface of the corresponding depletion layer suppression region 80 that faces that n-type semiconductor region 90.

While the semiconductor device 10 is ON, electrons flows between the emitter region 40 and the collector region 20. The electrons may pass from the emitter region 40 across an electron pathway C1 (i.e., the base region 30 and the n-type region 18) to reach the collector region 20. The concentration of n-type impurities of each of the n-type semiconductor regions 90 is higher than the concentration of n-type impurities of the n-type region 18. For this reason, an electron density of each of the n-type semiconductor regions 90 is higher than an electron density of the n-type region 18. As an electron density is higher, electrons flow more easily. In other words, as a region has a higher electron density, a current flows through the region more easily. For this reason, arranging the n-type semiconductor regions 90 between the emitter region 40 and the collector region 20 makes it easier for electrons to flow therein, i.e., makes it possible to decrease resistance to movement of electrons between the emitter region 40 and the collector region 20.

While the semiconductor device 10 is ON, setting the voltage applied to the base electrode 36 to zero with respect to the emitter electrode 46 causes the semiconductor device 10 to be turned off. In this case, the collector region 20 and the base region 30 are brought into a reverse bias state. At this occasion, a depletion layer 100 is formed between the collector region 20 and the base region 30. The depletion layer 100 has one end 100a located closer to the n-type region 18 than the boundary surface 52 between the base region 30 and the n-type region 18. The other end 100b of the depletion layer 100 is located closer to the base region 30 than the boundary surface 52 between the base region 30 and the n-type region 18. In the present embodiment, the depletion layer suppression regions 80 are located to face the n-type semiconductor regions 90. An area of a surface of each of the n-type semiconductor regions 90 that faces a corresponding one of the depletion layer suppression regions 80 is equal to an area of a surface of the corresponding depletion layer suppression region 80 that faces that n-type semiconductor region 90. For this reason, the low-concentration region 34 and the n-type semiconductor regions 90 are not in direct contact with each other. The concentration of p-type impurities of each of the depletion layer suppression regions 80 is higher than the concentration of p-type impurities of the low-concentration region 34. This makes it possible, also in a case where the n-type semiconductor regions 90 are provided, to suppress the spread of the end 100b toward the emitter region 40, as compared with a case where no depletion layer suppression regions 80 are provided.

In the present embodiment, as is evident from these descriptions, the n-type semiconductor regions 90 are located inside of the n-type region 18 and face the depletion layer suppression regions 80. This makes it possible, while improving the withstand voltage of the semiconductor device 10, to make it easier for a current to flow between the emitter region 40 and the collector region 20.

Third Embodiment

Figure 4:
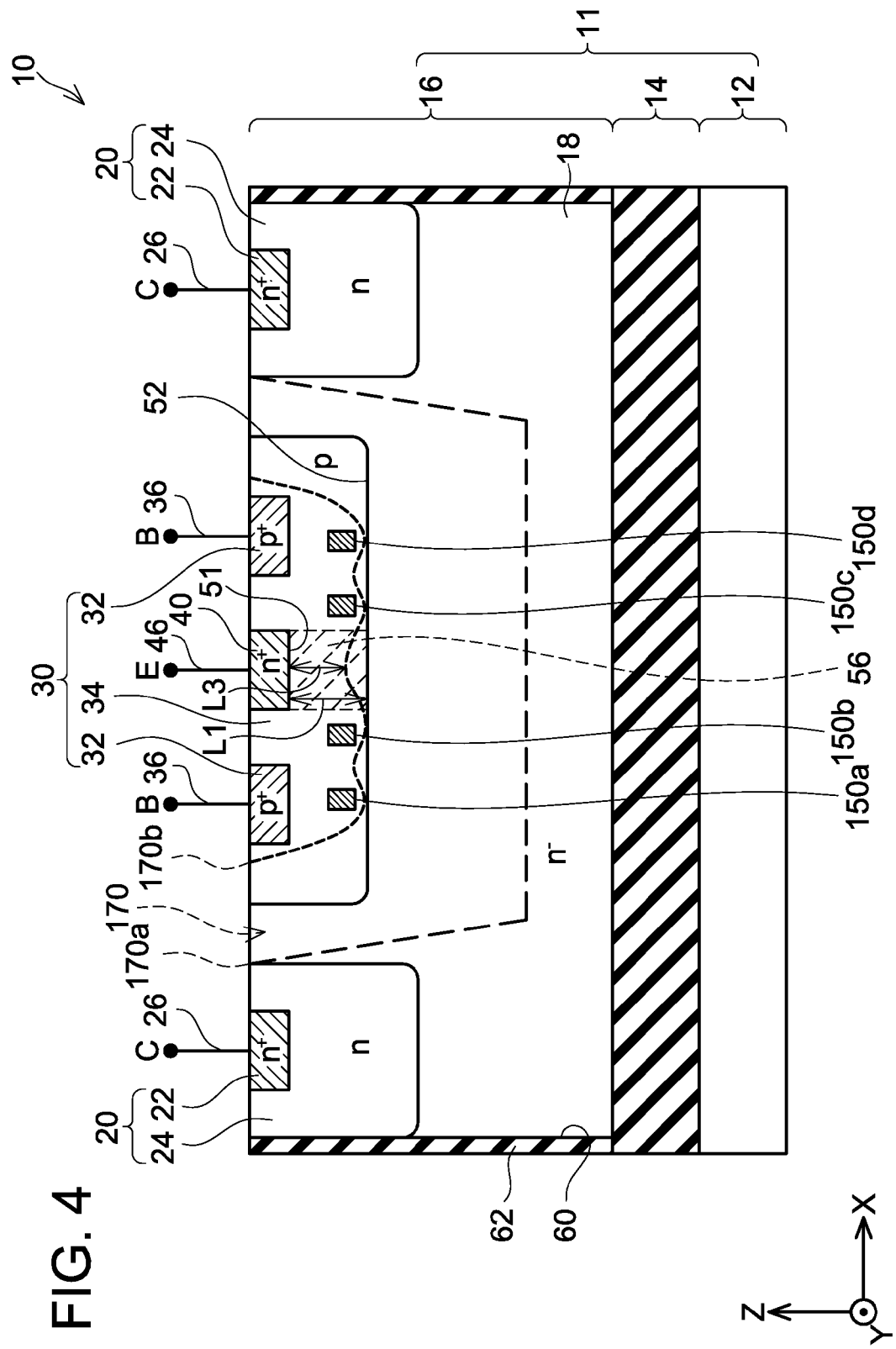
FIG. 4 is a cross-sectional view of a semiconductor device according to a third embodiment.

A third embodiment will be described with reference to FIG. 4. It should be noted that components identical to those of the first embodiment are given the same reference numerals, and as such, will not be described below. The third embodiment differs from the first embodiment in that no depletion layer suppression regions are arranged inside of the region 56. In the third embodiment, the semiconductor device 10 includes a plurality of depletion layer suppression regions 150a to 150d. It should be noted that the plurality of depletion layer suppression regions 150a to 150d has the same structure. In the following, the plurality of depletion layer suppression regions 150a to 150d is sometimes referred to as "depletion layer suppression regions 150" in case the regions 150a to 150d may be indiscriminately expressed.

The depletion layer suppression regions 150 are located inside of the base region 30 and arranged below the emitter region 40. The depletion layer suppression regions 150 are arranged substantially parallel to the front surface of the semiconductor layer 16. The depletion layer suppression regions 150 are arranged at intervals along the X direction. The depletion layer suppression regions 150 are arranged inside of the base region 30 and in the vicinity of the boundary surface 52, which is a boundary surface between the base region 30 and the n-type region 18. The depletion layer suppression regions 150 are arranged outside of the region 56.

While the semiconductor device 10 is ON, electrons are likely pass through the region 56 where the boundary surface 51 and the boundary surface 52 are placed at the shortest distance L1 from each other. In the present embodiment, no depletion layer suppression regions 150 are arranged in the region 56. This configuration makes it possible to enlarge the region 56 inside of the base region 30 where the boundary surface 51 and the boundary surface 52 are placed at the shortest distance L1 from each other. This makes it easier for electrons to pass through the region 56.

While the semiconductor device 10 is ON, setting the voltage applied to the base electrode 36 to zero with respect to the emitter electrode 46 causes the semiconductor device 10 to be turned off. In this case, the collector region 20 and the base region 30 are brought into a reverse bias state. At this occasion, a depletion layer 170 is formed between the collector region 20 and the base region 30. The depletion layer 170 has one end 170a located closer to the n-type region 18 than the boundary surface 52 between the base region 30 and the n-type region 18. The other end 170b of the depletion layer 170 is located closer to the base region 30 than the boundary surface 52 between the base region 30 and the n-type region 18. In the present embodiment, the depletion layer suppression regions 150 are arranged inside of the base region 30 and in the vicinity of the boundary surface 52. This makes it possible to suppress the spread of the end 170b toward the emitter region 40 around a region where the depletion layer suppression regions 150 are arranged, as compared with a case where no depletion layer suppression regions 150 are arranged. Since the depletion layer suppression regions 150 suppress the spread of the end 170b toward the emitter region 40, a shortest distance L3 between the end 170b and the emitter region 40 can be increased. This makes it possible to improve the withstand voltage of the semiconductor device 10.

As is evident from these descriptions, the semiconductor device 10 according to the present embodiment includes the depletion layer suppression regions 150 arranged outside of the region 56. This configuration makes it possible to improve the withstand voltage of the semiconductor device 10 and make it easier for electrons to pass through the region 56.

The foregoing description of the first embodiment dealt with a case where the area of the surface of the depletion layer suppression region 50c that faces the emitter region 40 is smaller than the area of the surface of the emitter region 40 that faces the depletion layer suppression region 50c. However, the area of the surface of the depletion layer suppression region 50c that faces the emitter region 40 may not be necessarily be smaller than the area of the surface of the emitter region 40 that faces the depletion layer suppression region 50c. What is important here is that in the region where the boundary surface 51 and the boundary surface 52 are placed at the shortest distance L1 from each other, the area of the surface of the depletion layer suppression region 50c that faces the emitter region 40 is smaller than the area of the surface of the emitter region 40 that faces the depletion layer suppression region 50c. That is, it is necessary that in a planar view of the semiconductor device 10, the depletion layer suppression region 50c is overlapped with a part of the emitter region 40 and a part of the emitter region 40 overlap the n-type region 18. The "planar view" here refers to observing the emitter region 40 along a direction which connects the boundary surface 51 and the boundary surface 52 at the shortest distance L1 (in the first embodiment, from the direction of the front surface) from each other.

Some of the main features characteristic to the semiconductor device disclosed herein will be described below. It should be noted that the respective technical features described below are independent of one another, and are useful solely or in various combinations.

(First Feature) In one embodiment of the semiconductor device disclosed in the present disclosure, the depletion layer suppression region may be arranged inside of the shortest region where the distance between the first boundary surface and the second boundary surface is shortest. According to the above configuration, the depletion layer suppression region can suppress a spread of a depletion layer extending in the third semiconductor region when a reverse bias voltage is applied between the first main electrode and the second main electrode. This makes it possible to improve the withstand voltage of the semiconductor device.

(Second Feature) In one embodiment of the semiconductor device disclosed in the present disclosure, the depletion layer suppression region may be arranged outside of the shortest region. According to the above configuration carriers can easily pass the shortest region. Further, the depletion layer suppression region can suppress the spread of the depletion layer extending in the third semiconductor region when a reverse bias voltage is applied between the first main electrode and the second main electrode. This makes it possible to improve the withstand voltage of the semiconductor device.

(Third Feature) In one embodiment of the semiconductor device disclosed in the present disclosure, the semiconductor device may comprise a semiconductor substrate which incorporates the first semiconductor region, the second semiconductor region, the third semiconductor region, and the depletion layer suppression region. The first semiconductor region may be an emitter region exposed on a part of a front surface of the semiconductor substrate. The third semiconductor region may be a base region exposed on a part of the front surface of the semiconductor substrate, and may be in contact with a side surface and a rear surface of the first semiconductor region. The second semiconductor region may be a collector region exposed on a part of the front surface of the semiconductor substrate. According to the above configuration, the depletion layer suppression region can suppress the spread of the depletion layer extending in the third semiconductor region when a reverse bias voltage is applied between the first main electrode and the second main electrode. This makes it possible to improve the withstand voltage of the semiconductor device.

(Fourth Feature) In one embodiment of the semiconductor device disclosed in the present disclosure, the depletion layer suppression region may be a semiconductor region of the second conductivity type, and a concentration of second conductivity type impurities of the depletion layer suppression region may be higher than a concentration of the second conductivity type impurities of the third semiconductor region. According to the above configuration, the depletion layer suppression region, which has the concentration of second conductivity type impurities higher than the concentration of second conductivity type impurities of the third semiconductor region, can suppress the spread of the depletion layer extending in the third semiconductor region when a reverse bias voltage is applied between the first main electrode and the second main electrode. This makes it possible to improve the withstand voltage of the semiconductor device.

(Fifth Feature) In one embodiment of the semiconductor device disclosed in the present disclosure, the depletion layer suppression region may comprise an insulator. According to the above configuration, the depletion layer suppression region, which comprises an insulator, can suppress the spread of the depletion layer extending in the third semiconductor region when a reverse bias voltage is applied between the first main electrode and the second main electrode. This makes it possible to improve the withstand voltage of the semiconductor device.

(Sixth Feature) In one embodiment of the semiconductor device disclosed in the present disclosure, the semiconductor device may comprise a fourth semiconductor region arranged between the second semiconductor region and the third semiconductor region; and having a concentration of first conductivity type impurities lower than a concentration of the first conductivity type impurities of the second semiconductor region. The semiconductor device may comprise a fifth semiconductor region arranged inside of the fourth semiconductor region, facing the depletion layer suppression region, and having a concentration of the first conductivity type impurities higher than the concentration of the first conductivity type impurities of the fourth semiconductor region. According to the above configuration, by arranging the fifth semiconductor region having the concentration of first conductivity type impurities higher than the concentration of first conductivity type impurities of the fourth semiconductor region inside the fourth semiconductor region, current can easily flow in the fourth semiconductor region. Further, arranging the fifth semiconductor region in a position facing the depletion layer suppression region, can suppress the spread of the depletion layer extending in the third semiconductor region when a reverse bias voltage is applied between the first main electrode and the second main electrode. This makes it possible to improve the withstand voltage of the semiconductor device.

Specific examples of the present disclosure have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A semiconductor device comprising:
a first main electrode;
a second main electrode;
a first semiconductor region of a first conductivity type being in electrically contact with the first main electrode;
a second semiconductor region of the first conductivity type being in electrically contact with the second main electrode;
a third semiconductor region of a second conductivity type arranged between the first semiconductor region and the second semiconductor region, and separating the first semiconductor region and the second semiconductor region; and
a depletion layer suppression region arranged inside of the third semiconductor region, and being configured to suppress a spread of a depletion layer extending in the third semiconductor region when a reverse bias voltage is applied between the second semiconductor region and the third semiconductor region, wherein
the third semiconductor region comprises a shortest region where a distance between a first boundary surface and a second boundary surface is shortest, the first boundary surface being a boundary surface between the third semiconductor region and the first semiconductor region, and the second boundary surface being a boundary surface between the third semiconductor region and the second semiconductor region, and the shortest region includes a region where the depletion layer suppression region does not exist between the first boundary surface and the second boundary surface when the first boundary surface and the second boundary surface are viewed along a direction which connects the first boundary surface and the second boundary surface at a shortest distance from each other.

2. The semiconductor device according to claim 1, wherein the depletion layer suppression region is arranged inside of the shortest region.

3. The semiconductor device according to claim 1, wherein the depletion layer suppression region is arranged outside of the shortest region.

4. The semiconductor device according to claim 1, further comprising a semiconductor substrate which incorporates the first semiconductor region, the second semiconductor region, the third semiconductor region, and the depletion layer suppression region,
wherein
the first semiconductor region is an emitter region exposed on a part of a front surface of the semiconductor substrate,
the third semiconductor region is a base region exposed on a part of the front surface of the semiconductor substrate, and is in contact with a side surface and a rear surface of the first semiconductor region, and
the second semiconductor region is a collector region exposed on a part of the front surface of the semiconductor substrate.

5. The semiconductor device according to claim 1, wherein
the depletion layer suppression region is a semiconductor region of the second conductivity type,
a concentration of second conductivity type impurities of the depletion layer suppression region is higher than a concentration of the second conductivity type impurities of the third semiconductor region.

6. The semiconductor device according to claim 1, wherein
the depletion layer suppression region comprises an insulator.

7. The semiconductor device according to claim 4, further comprising:
a fourth semiconductor region arranged between the second semiconductor region and the third semiconductor region; and having a concentration of first conductivity type impurities lower than a concentration of the first conductivity type impurities of the second semiconductor region; and
a fifth semiconductor region arranged inside of the fourth semiconductor region, and facing the depletion layer suppression region, and having a concentration of the first conductivity type impurities higher than the concentration of the first conductivity type impurities of the fourth semiconductor region.

* * * * *